US012803066B2

(12) United States Patent
Yang et al.

(10) Patent No.: US 12,803,066 B2
(45) Date of Patent: Nov. 17, 2026

(54) BATTERY PACK AND POWER TOOL SYSTEM

(71) Applicant: Nanjing Chervon Industry Co., Ltd., Nanjing (CN)

(72) Inventors: Dong Yang, Nanjing (CN); Zhaotao Zhang, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 971 days.

(21) Appl. No.: 17/864,557

(22) Filed: Jul. 14, 2022

(65) Prior Publication Data

US 2023/0029949 A1 Feb. 2, 2023

(30) Foreign Application Priority Data

Jul. 22, 2021 (CN) ......................... 202110831611.0

(51) Int. Cl.

| | |
|---|---|
| ***H01M 10/42*** | (2006.01) |
| ***G01R 31/382*** | (2019.01) |
| ***H01M 10/0525*** | (2010.01) |
| ***H01M 10/48*** | (2006.01) |

(52) U.S. Cl.

CPC ........ *H01M 10/425* (2013.01); *G01R 31/382* (2019.01); *H01M 10/0525* (2013.01); *H01M 10/482* (2013.01); *H01M 10/486* (2013.01); *H01M 2010/4271* (2013.01); *H01M 2010/4278* (2013.01)

(58) Field of Classification Search

CPC ............ G01R 31/382; H01M 10/0525; H01M 10/425; H01M 10/482; H01M 10/486; H01M 10/4271; H01M 10/4278

See application file for complete search history.

(56) References Cited

U.S. PATENT DOCUMENTS

2008/0272736 A1 11/2008 Tien
2012/0183831 A1* 7/2012 Jeong .................. H01M 10/647 29/623.5
2014/0167705 A1 6/2014 Chang
(Continued)

FOREIGN PATENT DOCUMENTS

CN 103872398 A 6/2014
CN 209448458 U 9/2019
CN 112311038 A 4/2023
(Continued)

OTHER PUBLICATIONS

Machine Translation of KR 2018-0089698 A (Year: 2018).*
(Continued)

*Primary Examiner* — Sathavaram I Reddy

(74) *Attorney, Agent, or Firm* — Greenberg Traurig, LLP

(57) ABSTRACT

A power tool system includes a tool body for implementing the function of the power tool and a battery pack detachably connectable to the tool body. The battery pack also includes a housing and a cell assembly disposed in the housing and used for storing or releasing electrical energy. The battery pack also includes a battery management module electrically connected to a detection module and the cell assembly and configured to dynamically adjust a charge parameter of the battery pack or a discharge parameter of the battery pack according to the current cycle count of the battery pack.

8 Claims, 9 Drawing Sheets

(56) References Cited

U.S. PATENT DOCUMENTS

| | | | | |
|---|---|---|---|---|
| 2014/0327410 | A1 | 11/2014 | Patel et al. | |
| 2020/0176827 | A1* | 6/2020 | Mao | H01M 50/213 |

FOREIGN PATENT DOCUMENTS

| | | | |
|---|---|---|---|
| KR | 10-2018-0089698 | A | 8/2018 |
| WO | 2018008567 | A1 | 1/2018 |

OTHER PUBLICATIONS

EPO, extended European search report issued on European patent application No. 22184237.0, dated Jan. 9, 2023, 8 pages.
"Bq5105xB High-Efficiency Qi v1. 1-Compliant Wireless Power Receiver and Battery Charger," Mar. 31, 2015 (Mar. 31, 2015), XP055812847, Retrieved from the Internet: URL:https://datasheet.octopart.com/BO51 050B RH LR-Texas-instruments-datasheet-65712776.pdf, 43 pp.
Office Action from EP application No. 22184237.0, dated Oct. 9, 2024, 9 pp.
Jinrong Qian: "Li-ion battery-charger solutions for JEITA compliance", Analogue Applications Journal, No. Q1, Oct. 1, 2010 (Oct. 1, 2010), pp. 8-11, XP05577 4908, Retrieved from the Internet: URL:https://www.ti.com/lit/an/slyt365/slyt365.pdf.
Office Action from European application No. 22184237.0, dated Apr. 5, 2024, 9 pp.

* cited by examiner

BATTERY PACK AND POWER TOOL SYSTEM

RELATED APPLICATION INFORMATION

This application claims the benefit under 35 U.S.C. § 119(a) of Chinese Patent Application No. CN 202110831611.0, filed on Jul. 22, 2021, which application is incorporated herein by reference in its entirety.

BACKGROUND

With the continuous development of power tool technology, a battery is more and more widely applied. To match the application of a power tool, battery technology is continuously improved, and a battery capacity is continuously increased. During the operation of a battery, an extremely thin SEI film formed on the surface of the negative electrode causes a reduction in the battery capacity, and the change of the crystal structure on the surface of the positive electrode causes an increase in the internal resistance, resulting in the normal degradation of the battery. Additionally, the expansion and shrinkage caused by the embedment and separation of lithium ions on the electrode active material result in an increase in the internal resistance. An overcharge and a low-temperature charge cause abnormal degradation of the battery as well as precipitation of a lithium metal on the surface of the negative electrode, a reduction in the battery capacity, an increase in the risk of an internal short circuit. During the use of a battery, the temperature rises, and the service life attenuates to a certain extent. The heat generated by a current in the battery during charging causes an increase in the temperature of the battery. When the temperature of the battery is too high, not only the discharge capacity decreases and affects the normal use, but the battery is also prone to damage.

SUMMARY

A battery pack includes a housing, a cell assembly and a battery management module. The cell assembly is disposed in the housing and used for storing or releasing electrical energy. The battery management module is electrically connected to the cell assembly and configured to adjust the charge parameter of the battery pack or the discharge parameter of the battery pack in real time according to at least the current cycle count of the battery pack.

In one example, the battery pack also includes a storage module for storing the accumulated charge capacity of the battery pack.

In one example, the battery management module is configured to read the accumulated charge capacity of the battery pack through the storage module to obtain the current cycle count of the battery pack.

In one example, the battery pack also includes a detection module connected to the cell assembly to acquire the battery temperature of the battery pack or battery electric quantity of the battery pack.

In one example, when the battery pack is charged, the battery management module adjusts the charge parameter of the battery pack according to the current cycle count of the battery pack or the battery temperature of the battery pack.

In one example, after the charge function of the battery pack is enabled, the charge parameter is configured according to the current cycle count of the battery pack acquired by the battery management module.

In one example, during the process of charging the battery pack according to the charge parameter, the battery management module acquires the battery temperature of the battery pack in real time and dynamically adjusts the charge parameter according to the battery temperature.

In one example, the charge parameter of the battery pack includes at least a charge current or a charge voltage.

In one example, when the battery pack is discharged, the battery management module adjusts the discharge parameter of the battery pack according to the current cycle count of the battery pack and the battery electric quantity of the battery pack.

In one example, after the charge function of the battery pack is enabled, the discharge parameter is configured according to the current cycle count of the battery pack acquired by the battery management module.

In one example, during the process of discharging the battery pack according to the discharge parameter, the battery management module acquires the battery electric quantity of the battery pack in real time and dynamically adjusts the discharge parameter according to the battery electric quantity.

In one example, the discharge parameter of the battery pack includes at least a discharge current.

In one example, the detection module includes at least a temperature sensor for detecting the battery temperature of the battery pack.

In one example, the battery pack also includes a terminal module and a master switch. The master switch is connected in series between the terminal module and the cell assembly and used for enabling or disabling the electrical connection between the terminal module and the cell assembly.

In one example, the battery pack also includes a battery pack communication module electrically connected to the battery management module and used for information transmission with the outside world.

A power tool system includes a power tool, a battery pack, a charger and a battery management module. The battery pack includes at least a cell assembly and is used for providing the electrical energy for the power tool. The charger is used for charging the battery pack. The battery management module is configured to adjust the charge parameter of the battery pack or the discharge parameter of the battery pack according to at least the current cycle count of the battery pack.

In one example, the battery pack also includes a storage module for storing the accumulated charge capacity of the battery pack. The battery management module is configured to read the accumulated charge capacity of the battery pack through the storage module to obtain the current cycle count of the battery pack.

In one example, the battery pack is detachably connected to the charger or the power tool.

A power tool includes a tool body and a battery pack. The tool body is used for implementing the function of the power tool. The battery pack is detachably connectable to the tool body. The battery pack includes a housing and a cell assembly. The cell assembly is disposed in the housing and used for storing or releasing the electrical energy. The battery pack also includes a battery management module. The battery management module is electrically connected to the cell assembly and configured to dynamically adjust the charge parameter of the battery pack or the discharge parameter of the battery pack according to at least the current cycle count of the battery pack.

In one example, the battery pack also includes the detection module connected to the cell assembly to acquire battery electric quantity of the battery pack. During the process of discharging the battery pack, the battery management module dynamically adjusts the discharge parameter of the battery pack according to the current cycle count of the battery pack and the battery electric quantity of the battery pack. The discharge parameter includes at least the discharge current.

DETAILED DESCRIPTION

The present application is described below in detail in conjunction with drawings and examples.

Figure 1:
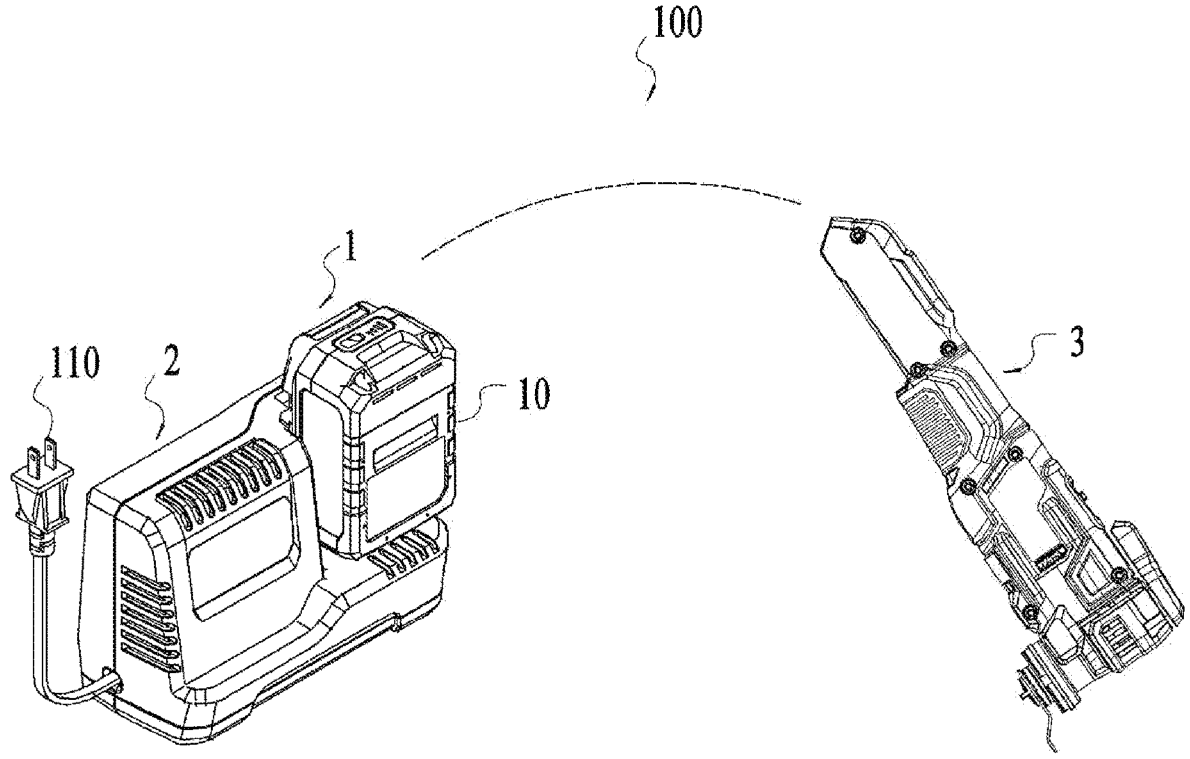
FIG. 1 is a view of a power tool system.

With reference to FIG. 1, a battery pack 1, a charger 2 and a power tool 3 form a power tool system 100. The battery pack 1 can be detachably connected to the charger 2 or the power tool 3 to perform the charge function and discharge function of the battery pack 1 separately. Specifically, the battery pack 1 can be detachably connected to the charger 2, and the charger 2 is connected to an external power to charge the battery pack 1. The battery pack 1 can be detachably connected to the power tool 3 and electrically connected to the power tool 3 through a terminal to supply power to the power tool 3 to perform the function of the power tool. It is to be noted that the power tool 3 in FIG. 1 is illustrative and is not intended to limit the type of the power tool.

Figure 2:
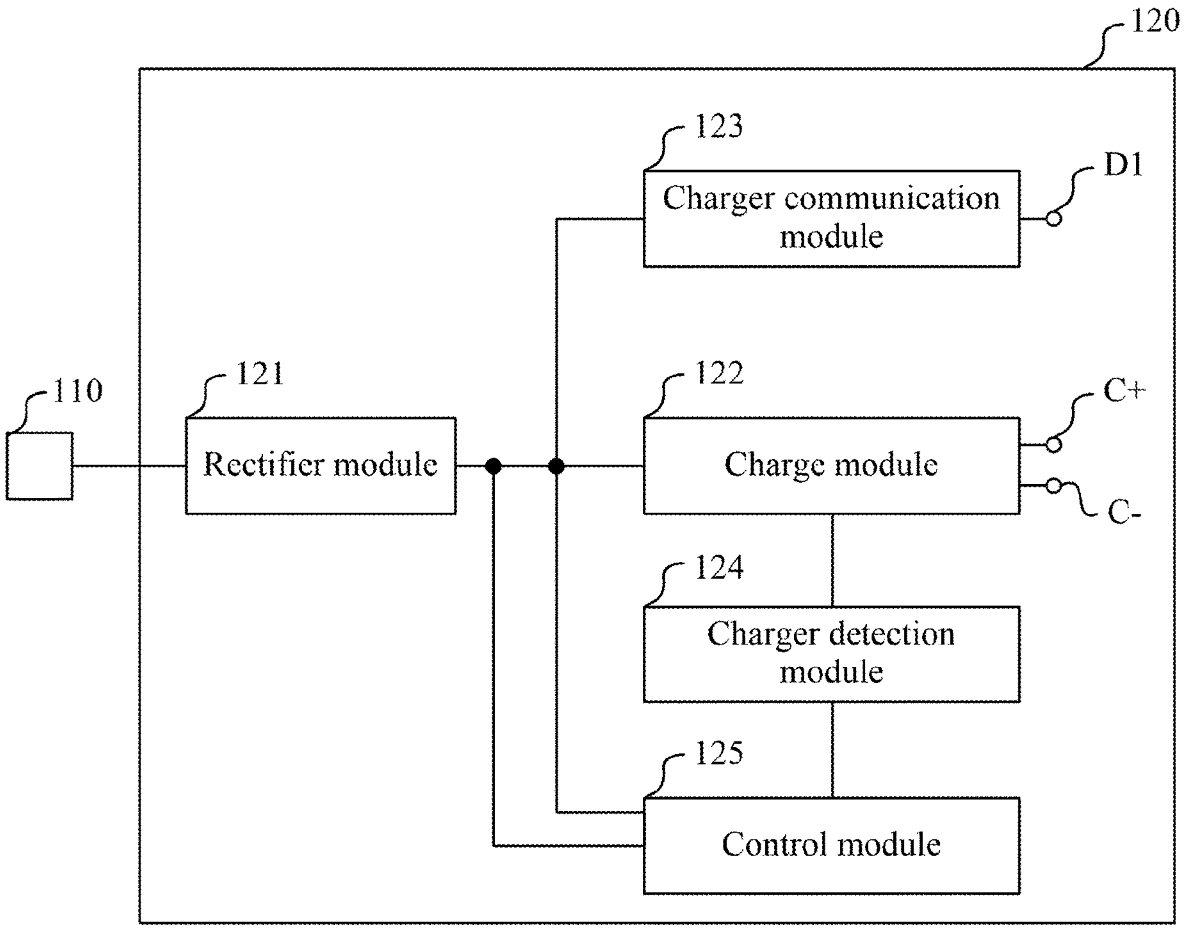
FIG. 2 is a block diagram illustrating the electrical principle of a charge circuit in a charger.

FIGS. 1 and 2 illustrate the structure of the charger 2. Specifically, the charger 2 includes an alternating current plug 110 for receiving alternating current mains and an internal charge circuit 120. Specifically, the charge circuit 120 converts the alternating current mains received by the alternating current plug 110 into a direct current to charge the battery pack 1.

In some examples, with reference to FIG. 2, the charge circuit 120 includes a rectifier module 121, a charge module 122, a charger communication module 123, a charger detection module 124 and a control module 125 that controls and is electrically connected to them. Specifically, the rectifier module 121 is electrically connected to the alternating current plug 110 to receive an alternating current. The rectifier module 121 converts the received alternating current into the direct current for use by the control module 125 and the charge module 122. In some examples, the rectifier module 121 includes an EMC circuit and an LLC circuit. The charge module 122 is provided with a charger positive terminal C+ and a charger negative terminal C− used for outputting charge electrical energy and used for being electrically connected to the battery pack 1 during charging. The charger communication module 123 is provided with a charger communication terminal D1 for being communicatively connected to the battery pack 1 during charging. In this manner, the control module 125 in the charger 2 and a battery management module in the battery pack 1 form data or signal interaction. The charger detection module 124 is electrically connected to the rectifier module 121 and the charge module 122 separately. The charger detection module 124 detects the electrical energy parameter of the charge module 122 and feeds back the electrical energy parameter to the control module 125.

Figure 3:
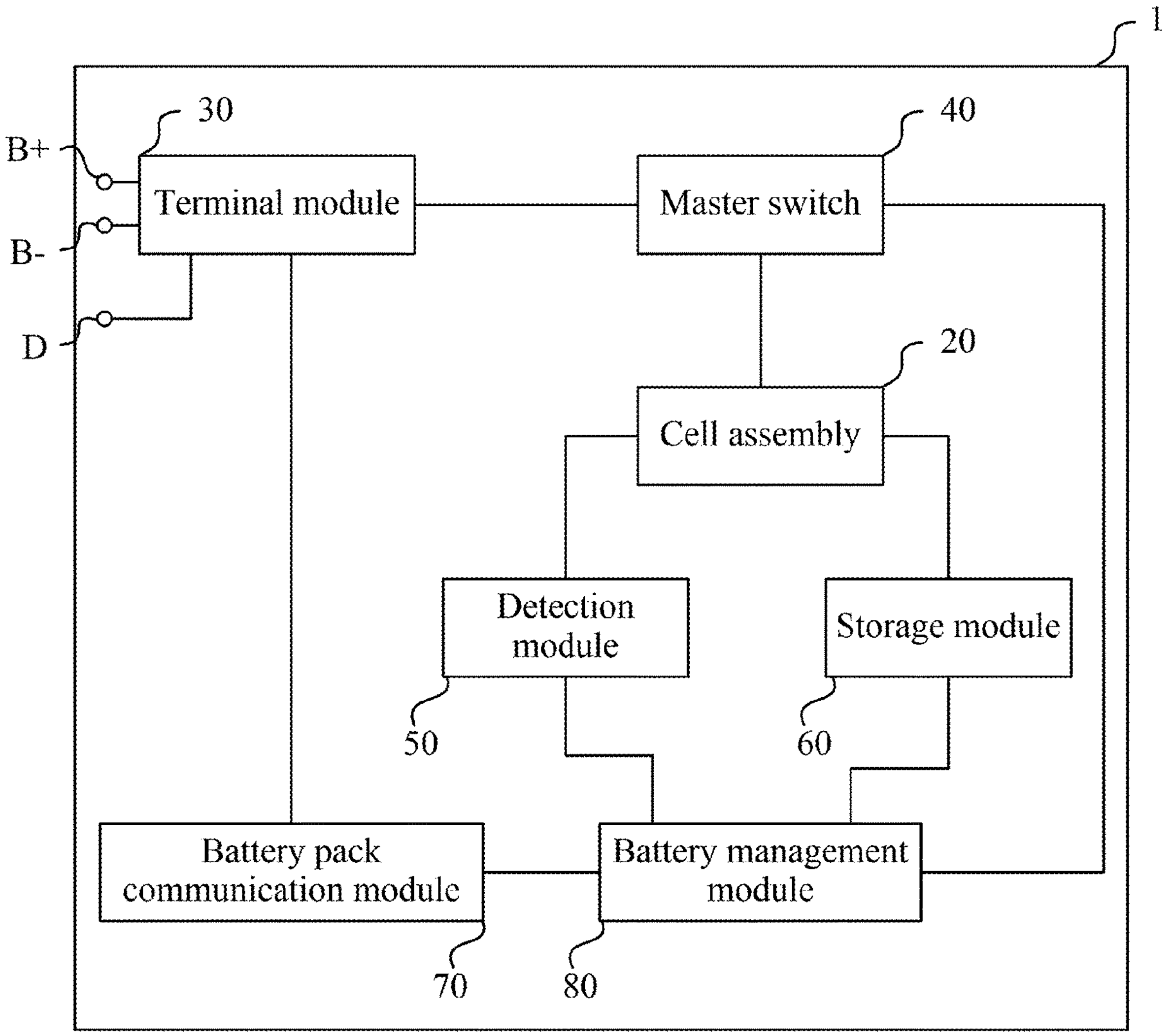
FIG. 3 is a block diagram illustrating the electrical principle of a battery pack.

With reference to FIGS. 1 to 3, the battery pack 1 includes a housing 10, a cell assembly 20, a terminal module 30, a master switch 40, a detection module 50, a storage module 60, a battery pack communication module 70 and a battery management module 80. Specifically, the housing 10 forms an accommodation chamber (not shown). The cell assembly 20, the master switch 40, the detection module 50, the storage module 60, the battery pack communication module 70 and the battery management module 80 are disposed in the accommodation chamber. The terminal module 30 is partially located in the accommodation chamber.

The cell assembly 20 includes at least one cell for storing or releasing electrical energy. Specifically, the cell assembly 20 includes multiple cells electrically connected to each other. The number of cells of the cell assembly 20 is determined by the required actual output voltage of the battery pack. The cells are connected in series or in parallel to each other. In some examples, multiple cells may be stacked.

The terminal module 30 is electrically connected to the cell assembly 20 and is provided with a battery pack positive terminal B+, a battery pack negative terminal B− and a battery pack communication terminal D. The battery pack positive terminal B+, the battery pack negative terminal B− and the battery pack communication terminal D are electrically connected to the outside world and configured to transfer electrical energy or signals. When the battery pack 1 is charged, the charger positive terminal C+ and the charger negative terminal C− on the charger 2 are electrically connected to the battery pack positive terminal B+ and the battery pack negative terminal B− on the battery pack 1 respectively to transmit the electrical energy.

In some examples, the battery pack 1 implements the configuration of the charge parameter or discharge parameter through the battery management module 80 and sends these configured parameters during charging or discharging through the battery pack communication terminal D. Specifically, when the battery pack 1 is in a charge state, the battery pack communication terminal D is electrically connected to the charger communication terminal D1 to transmit information to the control module 125 in the charger 2, thereby controlling the charging process when the charger 2 charges the battery pack 1. When the battery pack 1 is in a discharge state, the battery pack communication terminal D is electrically connected to the communication terminal (not shown) of the power tool 3 to transmit information to the power tool 3, thereby controlling the discharging process when the battery pack 1 supplies power to the power tool 3.

In other examples, the battery pack communication terminal D is configured as a port having a Bootloader function. A user or after-sales personnel may upgrade battery pack firmware through the battery pack communication terminal D. When the after-sales personnel needs to upgrade the battery pack firmware, the battery pack communication terminal D is connected to an external device to perform the upgrade directly without detaching the machine. In this manner, the difficulty of a firmware upgrade is greatly reduced, and the time of the firmware upgrade is shortened.

The master switch 40 is connected in series between the terminal module 30 and the cell assembly 20 to enable or disable the electrical connection between the terminal module 30 and the cell assembly 20. Specifically, when the master switch 40 is closed, the electrical connection between the terminal module 30 and the cell assembly 20 is enabled; and when the master switch 40 is opened, the electrical connection between the terminal module 30 and the cell assembly 20 is disabled. The master switch 40 is electrically connected to the battery management module 80. When the battery pack 1 is charged, the master switch 40 enables on the electrical connection between the terminal module 30 and the cell assembly 20, and the terminal module 30 enables multiple cells of the cell assembly 20 to be in a charged state.

A detection circuit 50 is electrically connected to the cell assembly 20 and the battery management module 80. In some examples, the detection circuit 50 is used for detecting some parameters of the battery pack 1 during charging or discharging. Specifically, the detection circuit 50 may be used for detecting the current, voltage, battery capacity and various parameters of the battery pack 1 during an operation.

A battery pack communication module 70 performs a data or signal exchange and is electrically connected to the battery management system 80. The battery pack communication module 70 may implement data transmission by a hardware connection or a wireless connection. When the battery pack 1 needs to communicate with the charger 2, the charger communication terminal D1 is electrically connected to the battery pack communication terminal D.

The battery management module 80 is mainly used for implementing functions such as a logical operation and process control. The battery management module 80 can control each assembly or module in the battery pack 1 to ensure the safety of the battery pack 1 during charging and discharging. In some examples, the battery management module 80 may use a control chip to implement the functions. In other examples, the battery management module 80 uses an SIP encapsulated chip or an SOC encapsulated chip to implement the functions of the battery management system. Specifically, functions of modules such as the storage module 60 and the battery pack communication module 70 are integrated into the battery management module to improve the integration of the circuit. This is not limited in the present application.

In some examples, the storage module 60 is used for storing information in the historical process of the battery pack 1. Specifically, the information in the historical process includes at least an accumulated charge capacity. The accumulated charge capacity may be defined as the sum of electric quantity accumulated in all times of charging of the battery pack 1. The cycle count of the battery pack 1 may be obtained through the accumulated charge capacity. In other examples, the information in the historical process also includes the recoverable capacity of the battery pack 1. The latest battery capacity from the time when a remaining battery capacity is 0 to the time when the battery is fully charged or from the time when the open-circuit voltage of battery pack 1 is less than 3.1 V to the time when the battery pack 1 is fully charged is recorded. In some examples, the degree of battery degradation may be represented by the accumulated charge capacity or recoverable capacity. Specifically, the accumulated charge capacity is proportional to the degree of battery degradation and inversely proportional to the recoverable capacity. It is to be understood that with the continuous accumulation of the time during which the battery pack 1 is used, a certain degree of degradation is inevitable.

In some examples, the detection module 50 can also detect the temperature of the battery pack 1 during the operation. In some examples, the detection module 50 is used for detecting the temperature of the cell assembly 20. Specifically, a temperature sensor is used for detecting the surface temperature of the cell assembly 20, and the detected temperature is set to the battery temperature of the battery pack 1. Preferably, the temperature sensor inside the battery pack 1 may be a thermistor such as an NTC or a PTC. In some examples, to acquire the most accurate battery temperature, the temperature sensor is disposed on the surface of a cell to detect the temperature of the surface of the cell to acquire the battery temperature. In other examples, the temperature sensor is disposed on the surface of at least one cell of the cell assembly 20. Specifically, cells having relatively high temperatures during the operation of the battery pack 1 are acquired by technical means, and a temperature sensor is disposed on each of the surfaces of these cells to acquire the battery temperature more accurately. In other examples, a temperature sensor having a lead is selected, and the length of the lead is customizable. Specifically, the lead is disposed between the battery management module 80 and a thermistor disposed on a PCB, and the battery management module 80 is electrically connected to the thermistor. The thermistor may be disposed on components that require temperature detection, such as the battery pack positive terminal B+ and the battery pack negative terminal B− on the terminal module 30 of the battery pack 1 or some components or accessories on the PCB that generate high heat during the operation. The temperature of a to-be-detected component is converted into an electrical signal through the thermistor, and the electrical signal is transmitted, through a lead having a customizable length, to the battery management module 80 to perform an analysis and control. In this manner, the temperature detection is more flexible.

In some examples, the detection module 50 can also detect the battery electric quantity of the battery pack 1 during the operation. The battery electric quantity may be obtained according to at least an integral of the detected charge current or discharge current of a battery and time. Specifically, the battery electric quantity is obtained in the following manner: The charge current or the discharge current of the battery is detected, and the battery electric quantity or the difference between the remaining electric quantity of the battery and the rated electric quantity of the battery or the proportion of the remaining electric quantity of the battery to the rated electric quantity of the battery is estimated according to at least an integral of the detected charge current or discharge current of the battery and time. In other examples of the present application, the battery electric quantity may be obtained according to a detected battery voltage. This is not limited in the present application. It is to be noted that the preset value of the battery electric quantity needs to be set according to battery attributes such as the chemical property, rated voltage and rated capacity of the battery; and the preset values of the temperatures and the preset values of the electric quantity of different batteries may be different or the same.

The control method of the battery pack 1 during charging and discharging is described below in detail.

In some specific examples, when the battery is in a charge state, the charge parameter of the battery pack 1 is dynamically adjusted according to the deterioration degree of the battery and the battery temperature. Specifically, the deterioration degree of the battery is proportional to the accumulated charge capacity. The cycle count of the battery may be obtained through the accumulated charge capacity. In this example, the current cycle count of the battery is used to represent the deterioration degree of the battery. Specifically, when the battery is in the charge state, the charge parameter of the battery pack 1 is dynamically adjusted according to the current cycle count of the battery and the battery temperature of the battery. The charge parameter of the battery pack 1 includes at least a charge current or a charge voltage. With reference to the battery charge flowcharts shown in FIGS. 4 and 5, a method is given by using an example in which a battery having a rated voltage of 4.2 V and a rated capacity of 3400 mAh is charged. In this method, charging at a constant current and then at a constant voltage is performed.

In some examples, a first preset cycle count is set to 300, and a second preset cycle count is set to 800. Of course, the preceding preset cycle count may be another value, and a designer needs to configure a value according to the specific performance of the battery. The values in the preceding example are merely illustrated and are not limited in the present application. The configuration method of a charge current I and a charge voltage U is described below in detail.

Figure 4:
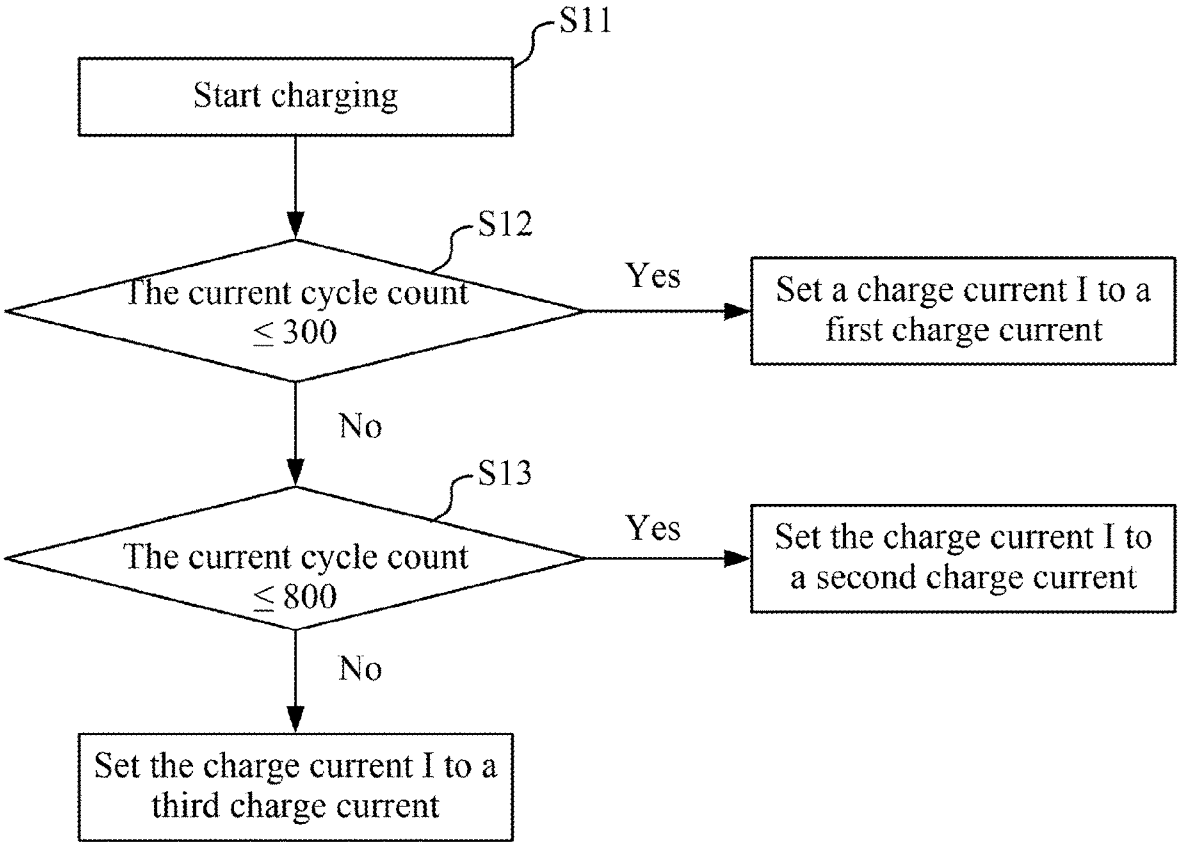
FIG. 4 is a flowchart of the configuration of a charge current according to the current cycle count.

With reference to FIG. 4, the configuration method of the charge current I is described below.

In S11, charging is started, and the method goes to step S12.

In S12, whether the current cycle count of the battery is less than or equal to 300 is determined; if yes, the charge current I is set to a first charge current; and if no, the method goes to step S13.

In S13, whether the current cycle count of the battery is less than or equal to 800 is determined; if yes, the charge current I is set to a second charge current; and if no, the charge current I is set to a third charge current.

Specifically, the accumulated charge capacity of the battery is acquired after the charge function of the battery pack is enabled. The current cycle count of the battery is obtained according to the proportion of the accumulated charge capacity of the battery to the rated capacity of the battery. The charge current is configured according to the current cycle count, specifically, the first charge current, the second charge current or the third charge current. It is to be noted that the first charge current, the second charge current and the third charge current are not fixed values in this example, but a set of preset data. Of course, those skilled in the art may also configure the first charge current, the second charge current and the third charge current to be fixed values for charging the battery. This is not limited in the present application.

In this example, in a charge method, charging at a constant current and then at a constant voltage is performed. After the charge current I is determined according to the current cycle count, specifically, the charge current I is one of the first charge current, the second charge current or the third charge current. The charge voltage U is also determined according to the current cycle count.

Figure 5:
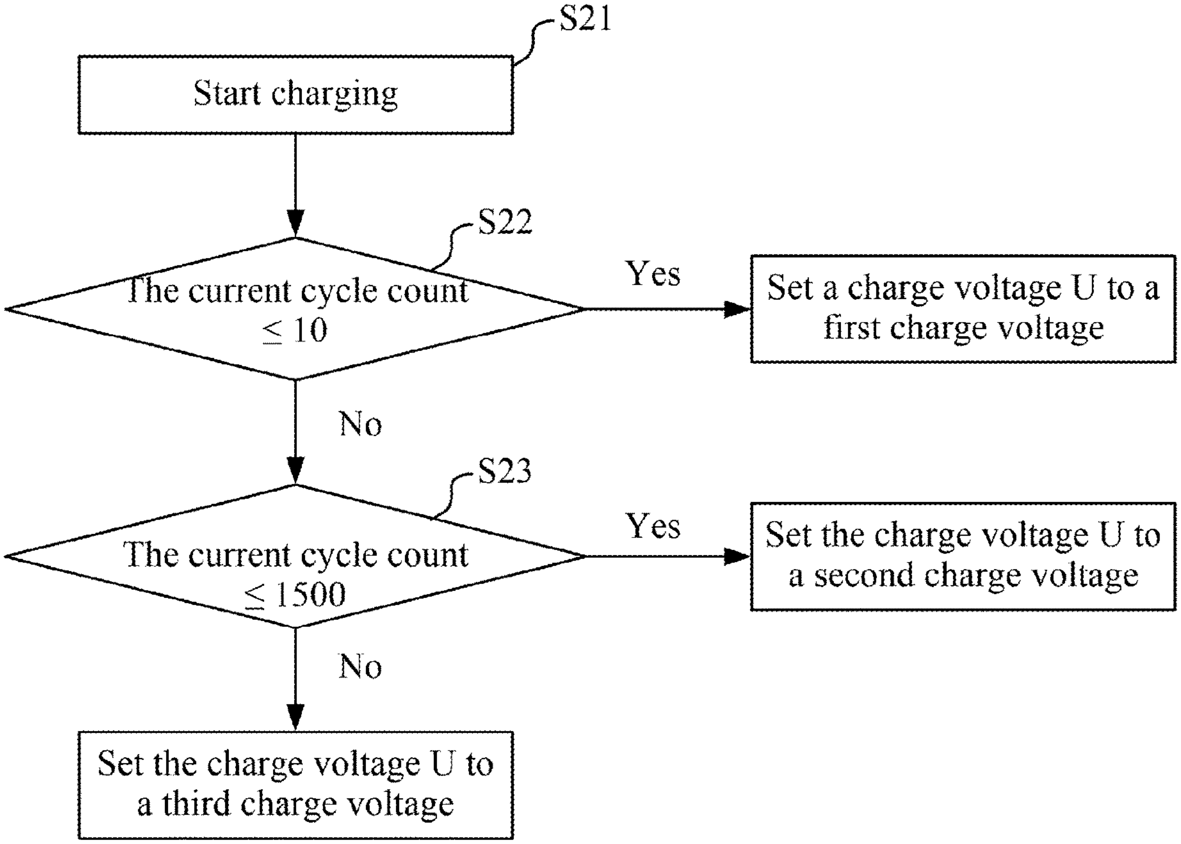
FIG. 5 is a flowchart of the configuration of a charge voltage according to the current cycle count.

With reference to FIG. 5, the configuration method of the charge voltage U is described below.

In S21, charging is started, and the method goes to step S22.

In S22, whether the current cycle count of the battery pack is less than or equal to 10 is determined; if yes, the charge voltage U is set to a first charge voltage; and if no, the method goes to step S23.

In S23, whether the current cycle count of the battery pack is less than or equal to 1500 is determined; if yes, the charge voltage U is set to a second charge voltage; and if no, the charge voltage U is set to a third charge voltage.

Specifically, the accumulated charge capacity of the battery is acquired after the charge function of the battery pack is enabled. The current cycle count of the battery is obtained according to the proportion of the accumulated charge capacity of the battery to the rated capacity of the battery. The charge voltage is configured according to the current cycle count, specifically, the first charge voltage, the second charge voltage or the third charge voltage. It is to be noted that the first charge voltage, the second charge voltage and the third charge voltage are not fixed values in this example, but a set of preset data. Of course, those skilled in the art may also configure the first charge voltage, the second charge voltage and the third charge voltage to be fixed values for charging the battery. This is not limited in the present application.

After charging is started, the corresponding charge current I and charge voltage U are configured according to the current cycle count of the battery. Specifically, the charge current I includes at least a first charge current, a second charge current and a third charge current. The charge voltage U includes at least a first charge voltage, a second charge voltage and a third charge voltage. For example, the current cycle count of the battery is 8, and the charge current I and the charge voltage U of the battery are set to the first charge current and the first charge voltage respectively. For another example, the current cycle count of the battery is 1000, and the charge current I and the charge voltage U of the battery are set to the third charge current and the second charge voltage respectively. Some preceding examples explain that the charge current I and the charge voltage U are a set of data that varies with the battery temperature. The configuration method of the charge current I and the charge voltage U is described below in detail.

Figure 6:
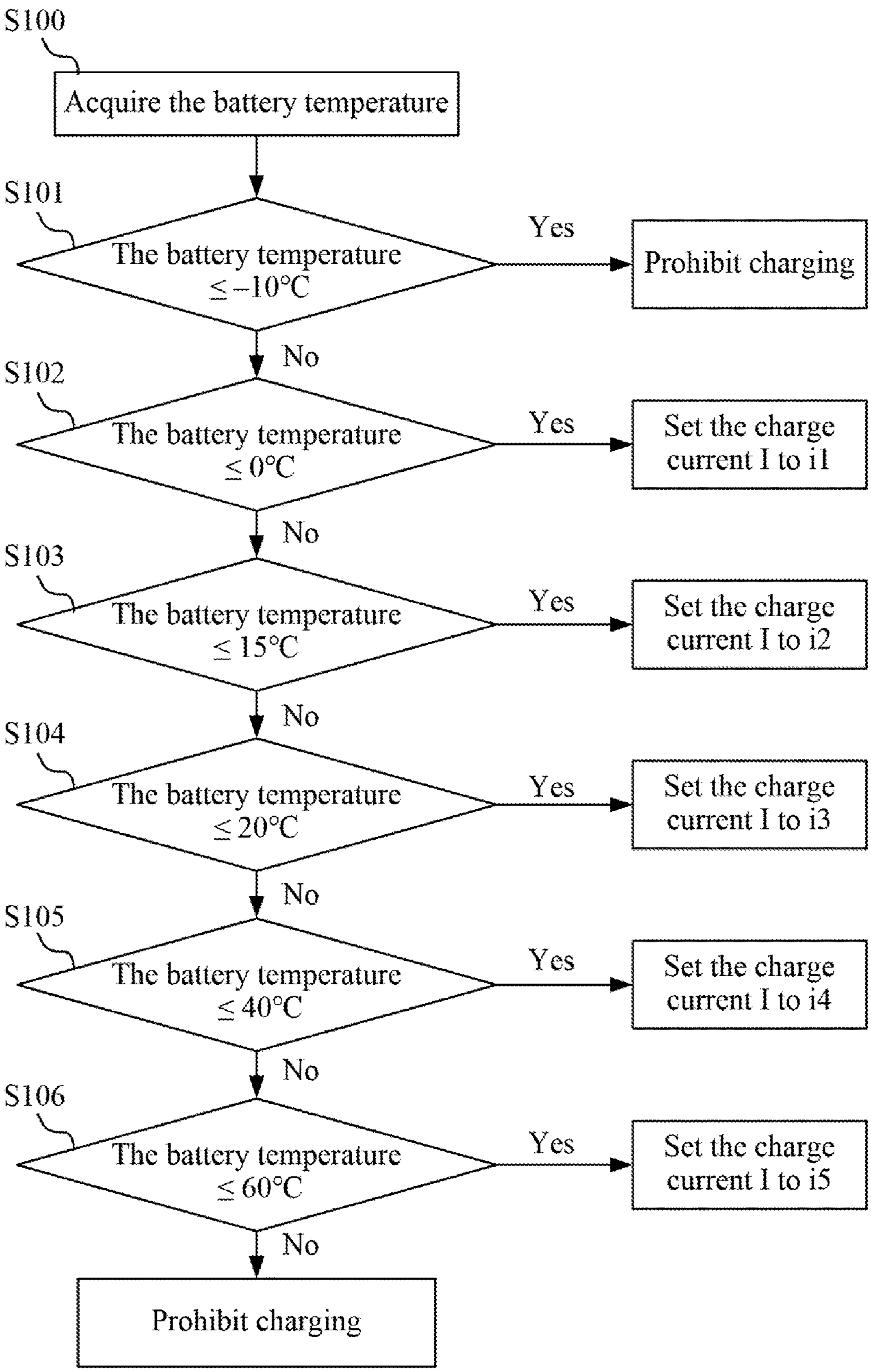
FIG. 6 is a flowchart of a dynamic adjustment of a charge current according to a battery temperature.

With reference to FIG. 6, the steps of the specific method of a dynamic adjustment of the charge current I during charging are below.

In S100, the battery temperature is acquired, and the method goes to step S101.

In S101, whether the battery temperature is less than ~10° C. is determined; if yes, charging is prohibited; and if no, the method goes to step S102.

In S102, whether the battery temperature is less than 0° C. is determined; if yes, the charge current I of the battery is set to i1, and the method goes to step S100; and if no, the method goes to step S103.

In S103, whether the battery temperature is less than 15° C. is determined; if yes, the charge current I of the battery is set to i2, and the method goes to step S100; and if no, the method goes to step S104.

In S104, whether the battery temperature is less than 20° C. is determined; if yes, the charge current I of the battery is set to i3, and the method goes to step S100; and if no, the method goes to step S105.

In S105, whether the battery temperature is less than 40° C. is determined; if yes, the charge current I of the battery is set to i4, and the method goes to step S100; and if no, the method goes to step S106.

In S106, whether the battery temperature is less than 60° C. is determined; if yes, the charge current I of the battery is set to i5, and the method goes to step S100; and if no, charging is prohibited.

In the preceding example, the value of the charge current I is dynamically adjusted according to the battery temperature, specifically, one of the first charge current, the second charge current or the third charge current. In some examples, the battery temperature is pre-divided into at least five temperature ranges, and each temperature range corresponds to one charge current value. It is to be noted that those skilled in the art may also divide a temperature range or configure a more detailed temperature interval by themselves, that is, temperature preset values in the preceding example are not limited in the present application.

The maximum allowable charge current of the battery is related to the battery temperature. Within a certain allowable temperature range, the higher the battery temperature is, the greater the maximum allowable current of the battery is. Specifically, when the first charge current is used for charging, optionally, i1 is set to 3 A, i2 is set to 7 A, i3 is set to 20 A, i4 is set to 27 A, and the value range of i5 is set to less than or equal to 27 A and greater than or equal to 0 A. When the third charge current is used for charging, optionally, i1 is set to 1 A, i2 is set to 3 A, i3 is set to 10 A, i4 is set to 15 A, and the value range of i5 is set to less than or equal to 15 A and greater than or equal to 0 A.

In some examples, the configuration method of the second charge current is different from the preceding configuration of the first charge current and the third charge current. The configuration method of the second charge current is described below in detail.

It is defined that it in the first charge current is set to m, it in the third charge current is set to n, and the current cycle count is set to L. Then i1 in the second charge current is defined as:

$$i1 = m - (L - 300) \times \frac{m - n}{500} \qquad (1)$$

It is to be noted that the configuration of it in the second charge current differs from the configuration of i1 in the first charge current and i1 in the third charge current in that there is a linear relationship between i1 in the second charge current and the current cycle count L. Additionally, according to the preceding configuration method of i1 in the second charge current, corresponding i2, i3, i4 and i5 in the second charge current can be obtained, and details are not repeated in the present application.

In other examples, i5 is also configured in the following manner:

$$i5 = I_{chargemax@40°\ C.} \times (T - 40°\ C.)/20°\ C. \qquad (2)$$

$I_{chargemax@40°\ C.}$ denotes the maximum charge current value when the battery temperature is 40° C., and T denotes the battery temperature.

Using an example in which a lithium battery has a rated capacity of 3400 mAh and a rated voltage of 4.2 V, the relationship between a maximum allowable charge current and the battery temperature may be expressed by the following relationship:

$$I_{chargemax@40°\ C.} = 3.7 \times e^{-5.6/T} \qquad (3)$$

$I_{chargemax@40°\ C.}$ denotes the maximum allowable charge current of the battery. T denotes the battery temperature. However, the relationships between the maximum allowable charge currents and the battery temperatures of batteries having different attributes (such as a battery chemical property, a rated capacity and a rated voltage) are different. The relationship between the maximum allowable charge current and the battery temperature of other batteries may be obtained through repeated tests.

In the preceding example, the specific steps of dynamically adjusting the charge current according to the battery temperature are described in detail. In some specific examples, a charge method of charging at a constant current and then at a constant voltage until the battery is fully charged is configured. In this example, the charge voltage of the battery is also dynamically adjusted while the charge current of the battery is dynamically adjusted according to the current cycle count of the battery and the battery temperature of the battery.

Figure 7:
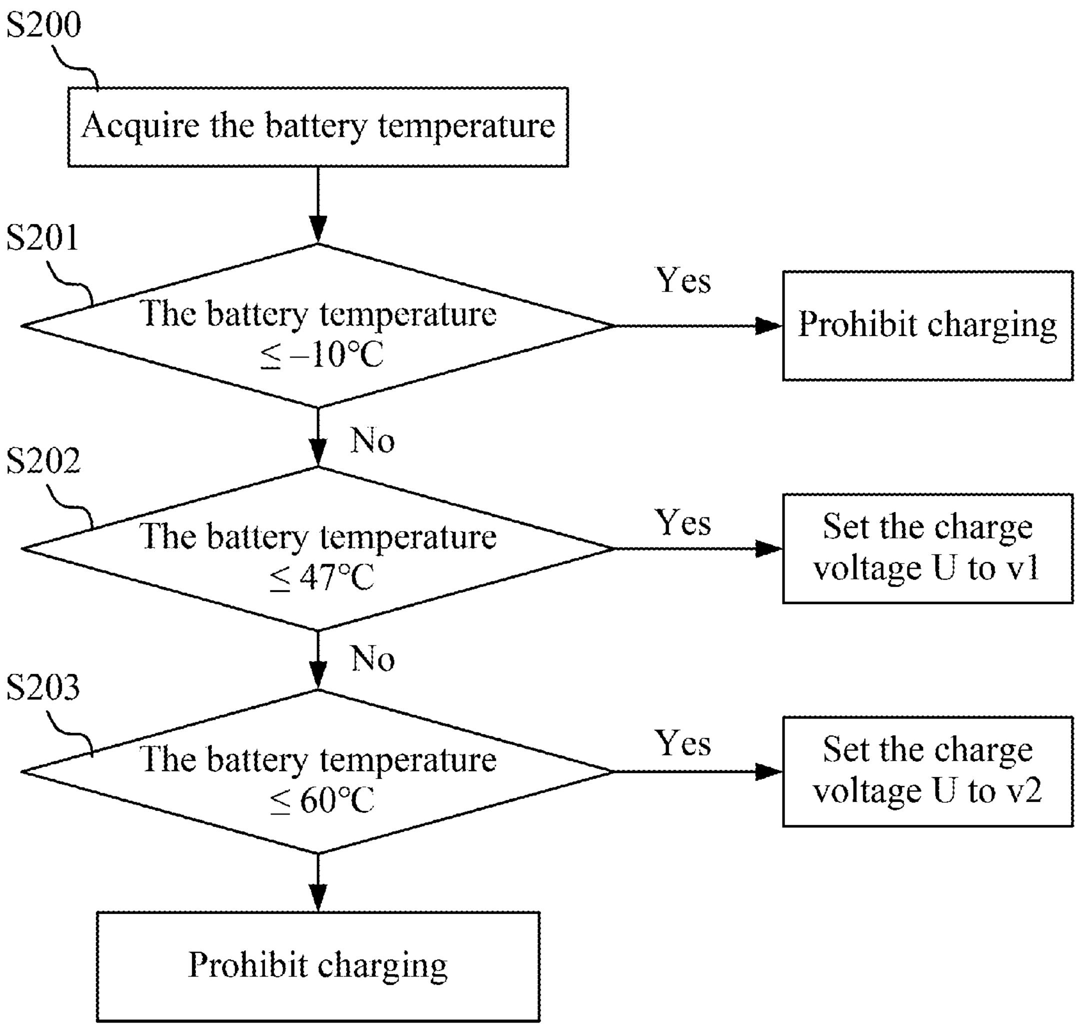
FIG. 7 is a flowchart of a dynamic adjustment of a charge voltage according to a battery temperature.

With reference to FIG. 7, the specific steps of a dynamic adjustment of the charge voltage during charging are below.

In S200, the battery temperature is acquired, and the method goes to step 201.

In S201, whether the battery temperature is less than ~10° C. is determined; if yes, charging is prohibited; and if no, the method goes to step S202.

In S202, whether the battery temperature is less than or equal to 47° C. is determined; if yes, the charge voltage U of the battery is set to v1, and the method goes to step S200; and if no, the method goes to step S203.

In S203, whether the battery temperature is less than 60° C. is determined; if yes, the charge voltage U of the battery is set to v2, and the method goes to step S200; and if no, charging is prohibited.

In the preceding example, the value of the charge voltage U is dynamically adjusted according to the battery temperature, specifically, one of the first charge voltage, the second charge voltage or the third charge voltage. The battery temperature is pre-divided into at least 2 temperature ranges, and each temperature range corresponds to one charge voltage value. It is to be noted that those skilled in the art may also divide a temperature range or configure a more detailed temperature interval autonomously. This is not limited in this example.

Specifically, when the first charge voltage is used for charging, optionally, v1 is set to 4.2 V, and v2 is set to 4.1 V. When the third charge voltage is used for charging, optionally, v1 is set to 4.1 V, and v2 is set to 4.1 V. It is also to be noted that those skilled in the art need to design values of v1 and v2 according to the actual situation of battery pack, and the values of v1 and v2 are not limited in this example.

In some examples, the configuration method of the second charge voltage is different from the preceding configuration of the first charge voltage and the third charge voltage. The configuration method of the second charge voltage is described below in detail.

It is defined that v1 in the first charge voltage is set to x, v1 in the third charge voltage is set to y, and the current cycle count is set to L. Then v1 in the second charge voltage is defined as:

$$v1 = x - (L - 10) \times \frac{x - y}{1490} \qquad (4)$$

It is to be noted that the configuration of the second charge voltage v1 differs from the configuration of the first charge voltage v1 and the third charge voltage v1 in that there is a linear relationship between the second charge voltage v1 and the current cycle count L. Additionally, according to the preceding configuration method of the second charge voltage v1, corresponding v2 can be obtained, and details are not repeated in the present application.

Figure 8:
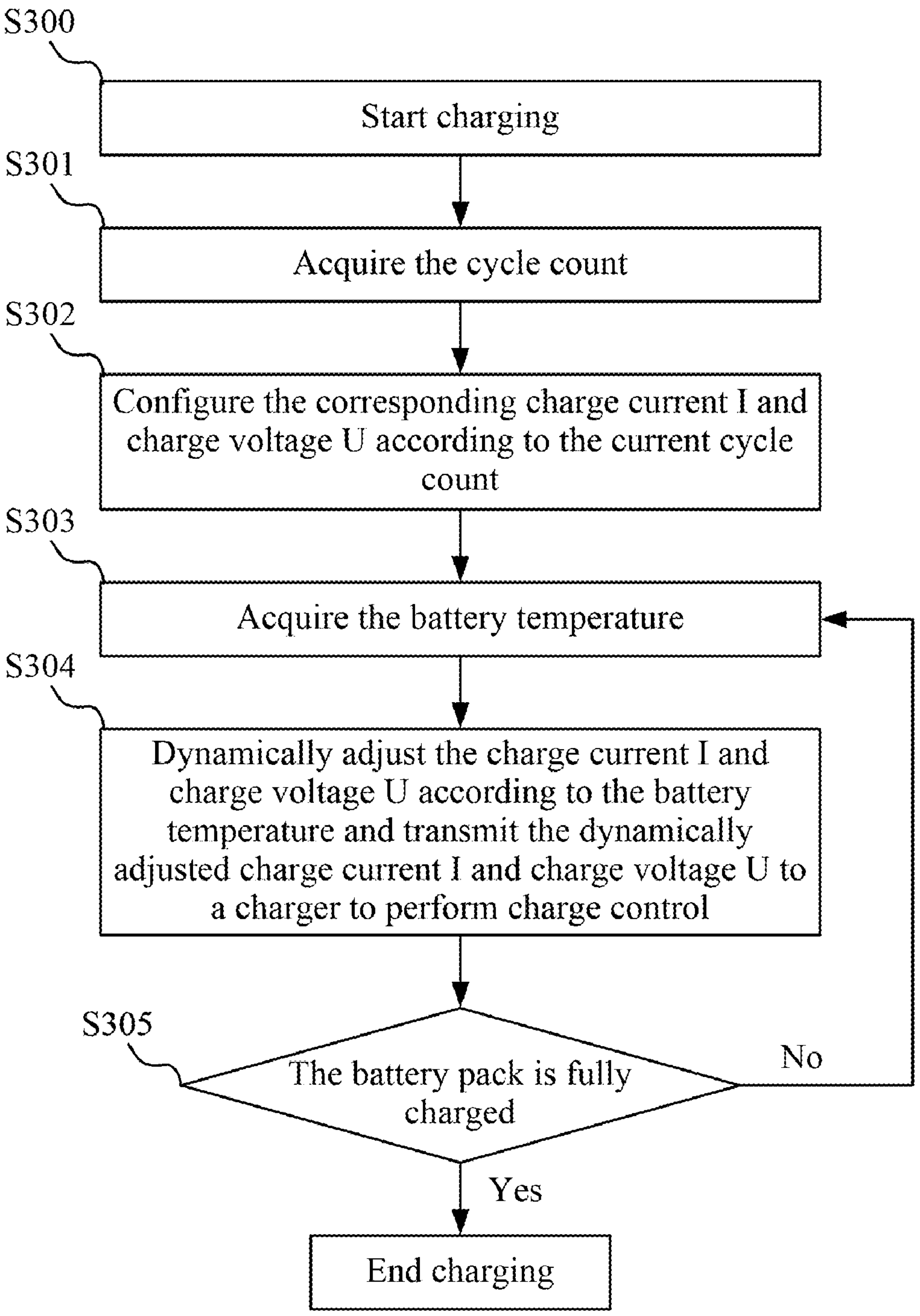
FIG. 8 is a flowchart of the charge control of the battery pack.

In some preceding examples, the configuration steps of the charge current I and the charge voltage U during charging are described in detail. When charging is started, the current cycle count is determined first, then the corresponding charge current I and charge voltage U are selected according to the current cycle count, and then the charge current I and charge voltage U are dynamically adjusted through the battery temperature. With reference to FIG. 8, the specific control steps during charging are described below in detail.

In S300, charging is started, and the method goes to step S301.

In S301, the current cycle count is acquired.

In S302, the corresponding charge current I and charge voltage U are configured according to the current cycle count.

In S303, the battery temperature is acquired.

In S304, the charge current I and charge voltage U are dynamically adjusted according to the battery temperature, and the dynamically adjusted charge current I and charge voltage U are transmitted to the charger to perform charge control.

In S305, whether the battery pack is fully charged is determined; if yes; charging is ended; and if no, the method goes to step S303.

In some preceding examples, the charge method is based on a conventional constant current-constant voltage charge method to dynamically adjust the charge current and the charge voltage in combination with the deterioration degree of the battery and the battery temperature of the battery and make full use of the charge capability of the battery pack without affecting the battery service life. In the present application, the deterioration degree of the battery is represented by the cycle count calculated through the accumulated charge capacity of the battery pack. In other examples, the deterioration degree of the battery pack also includes an abnormal degradation degree. Specifically, the abnormal degradation degree may be represented by parameters such as battery overcharge and battery overdischarge, and details are not repeated in the present application. Those skilled in the art may autonomously perform a design. In the present application, the example of the deterioration degree is an abnormal degradation degree, but is not limited to the abnormal degradation degree. Description is here, and details are not repeated below.

The discharging process of the battery is different from the charging process in that the discharge current is dynamically adjusted according to the battery electric quantity. The control method of the battery during discharging is described below in detail. It is to be noted that in an example, the battery electric quantity may be obtained according to at least an integral of the detected discharge current of the battery and time. Specifically, the battery electric quantity is obtained in the following manner: The discharge current of the battery is detected, and the battery electric quantity, or the difference the remaining electric quantity of the battery and the rated electric quantity of the battery or the proportion of the remaining electric quantity of the battery to the rated electric quantity of the battery is estimated according to at least an integral of the detected discharge current of the battery and time. In this example of the present application, the battery electric quantity is preferably set to the proportion of the remaining electric quantity of the battery to the rated electric quantity of the battery. However, this is not limited in the present application.

In some examples, the battery is a lithium battery having a rated capacity of 3400 mAh and a rated voltage of 4.2 V. When the battery is discharged, as in the charging process, a discharge current I' is configured through the current cycle count of the battery. It is to be noted that in this example, the discharge current I' is set to data that varies with the battery electric quantity. Specifically, after a set of discharge currents corresponding to the discharge currents I' is determined through the current cycle count, the current value corresponding to the discharge current I' is set according to the battery electric quantity. Those skilled in the art should configure the threshold value of the cycle count or the preset interval of the cycle count and the threshold value of the battery electric quantity or the preset interval of the battery electric quantity according to the selected battery attributes. This is not limited in the present application. It is to be noted that during discharging, there is a linear relationship between the discharge current and the current cycle count. The configuration of the specific linear relationship is similar to the configuration method in the preceding charging process, and the details are not repeated here. Of course, those skilled in the art may also set the discharge current I' to a fixed value or a function related to the battery electric quantity. This is not limited in the present application.

Figure 9:
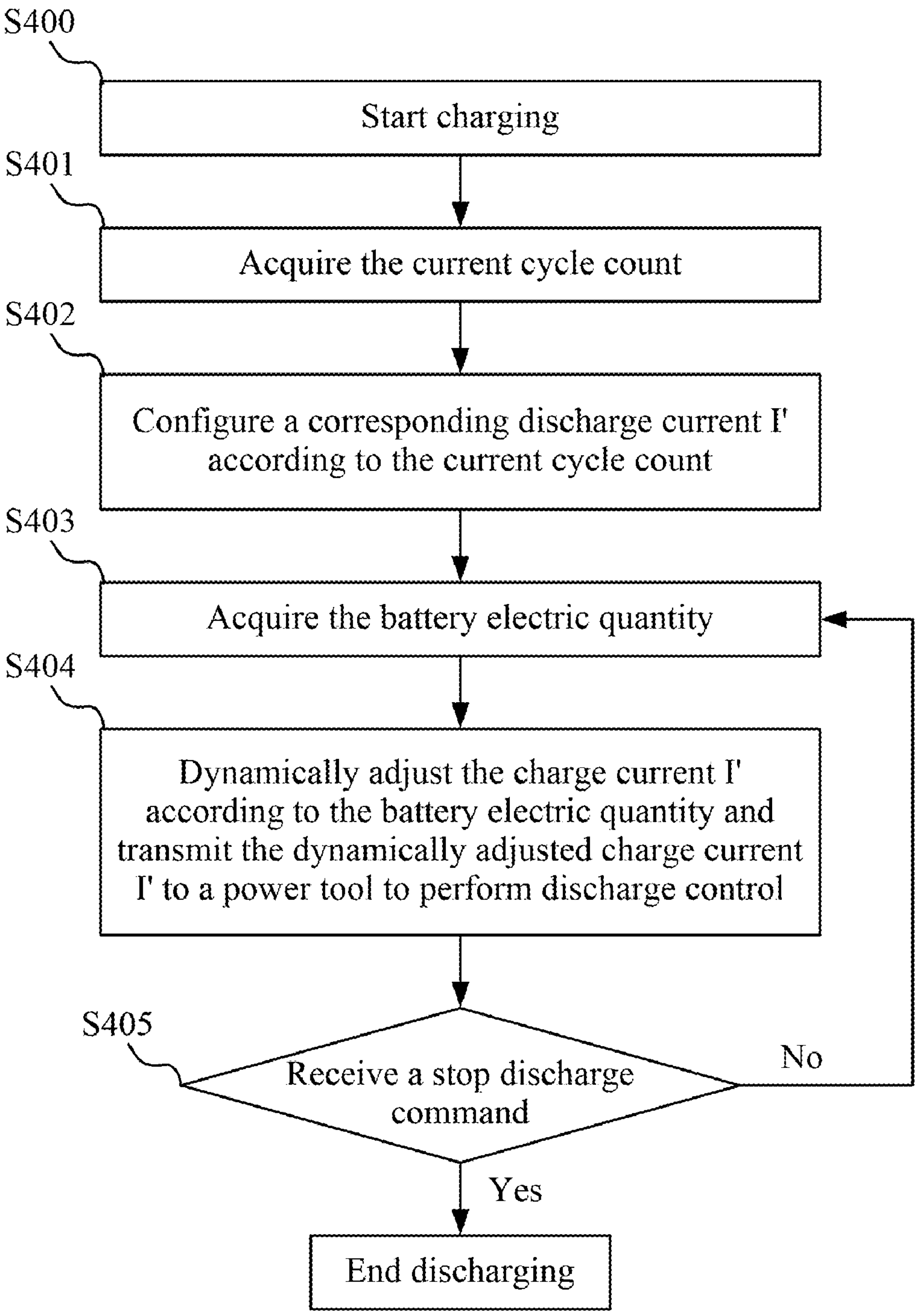
FIG. 9 is a flowchart of the discharge control of the battery pack.

With reference to FIG. 9, when discharging is started, the current cycle count is determined first, then the corresponding discharge current I' is selected according to the current cycle count, and then the discharge current I' is dynamically adjusted through the battery electric quantity. The specific control steps during discharging are described below in detail.

In S400, discharging is started, and the method goes to step S401.

In S401, the corresponding discharge current I' is set according to the current cycle count.

In S402, the battery electric quantity is acquired.

In S403, the discharge current I' is dynamically adjusted according to the battery electric quantity.

In S404, the battery pack transmits the dynamically adjusted discharge current I' to the power tool to perform discharge control.

In S405, whether a stop discharge command is received; if yes, discharging is stopped; and if no, the method goes to step S402.

In this example, the battery electric quantity during discharging is related to the battery attributes. Batteries having different attributes have different battery electric quantity during discharging. The battery attributes include a battery chemical property, a rated capacity and a rated voltage.

What is claimed is:

1. A power tool system, comprising:

a power tool;

a battery pack electrically couplable to the power tool for supplying operating power to the power tool, the battery pack comprising:

a housing;

a detection module configured to acquire a battery electric quantity of the battery pack;

a cell assembly disposed in the housing and used for storing electrical energy;

a battery management module electrically connected to the cell assembly and configured to adjust a charge parameter of the battery pack and a discharge parameter of the battery pack in real time according to at least a current cycle count of the battery pack; and a storage module for storing an accumulated charge capacity of the battery pack, wherein the current cycle count is determined by the battery management module as a total accumulated charge capacity divided by a battery rated capacity and, when the battery pack is discharged, the battery management module first determines the current cycle count, then selects the discharge parameter according to the current cycle count, and then dynamically adjusts the discharge parameter of the battery pack through the battery electric quantity; and a battery pack charger, electrically couplable to the battery pack for recharging the battery pack.

2. The power tool system according to claim 1, wherein, when the battery pack is charged, the battery management module adjusts the charge parameter of the battery pack according to the current cycle count of the battery pack or the battery temperature of the battery pack.

3. The power tool system according to claim 1, wherein, after a charge function of the battery pack is enabled, the battery management module adjusts the charge parameter according to the current cycle count of the battery pack.

4. The power tool system according to claim 3, wherein, during a process of charging the battery pack according to the charge parameter, the battery management module acquires a battery temperature of the battery pack in real time and dynamically adjusts the charge parameter according to the battery temperature.

5. The power tool system according to claim 4, wherein the charge parameter of the battery pack comprises at least a charge current or a charge voltage.

6. The power tool system according to claim 1, wherein the discharge parameter of the battery pack comprises at least a discharge current.

7. The power tool system according to claim 1, further comprising:

a terminal module and a master switch, wherein the master switch is connected in series between the terminal module and the cell assembly and used for enabling or disabling an electrical connection between the terminal module and the cell assembly.

8. The power tool system according to claim 7, further comprising:

a battery pack communication module electrically connected to the battery management module and used for information transmission with an outside world.

* * * * *